(12) United States Patent
Gonthier

(10) Patent No.: US 6,208,126 B1
(45) Date of Patent: Mar. 27, 2001

(54) CIRCUIT HAVING A BIDIRECTIONAL SWITCH FOR SUPPLYING A LOAD FROM AN AC VOLTAGE SUPPLY

(75) Inventor: Laurent Gonthier, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/447,130

(22) Filed: Nov. 22, 1999

(30) Foreign Application Priority Data

Nov. 27, 1998 (FR) .................................................. 98 15150

(51) Int. Cl.$^7$ ........................................................ G05F 1/455
(52) U.S. Cl. ............................................. 323/324; 323/239
(58) Field of Search .................................. 323/237, 239, 323/320, 324

(56) References Cited

U.S. PATENT DOCUMENTS

| | | | |
|---|---|---|---|
| 3,532,900 | * | 10/1970 | Rhyne . |
| 3,665,293 | * | 5/1972 | Keiler et al. . |
| 3,735,158 | * | 5/1973 | McDonald . |
| 3,936,726 | * | 2/1976 | Kelly . |
| 4,737,667 | | 4/1988 | Tihanyi .............................. 307/482 |
| 4,743,834 | * | 5/1988 | Rice .................................... 323/239 |
| 4,870,340 | * | 9/1989 | Kral .................................... 323/239 |
| 4,935,691 | * | 6/1990 | Lamar ................................. 323/320 |
| 5,140,255 | * | 8/1992 | Tardio et al. ....................... 323/324 |
| 5,247,242 | * | 9/1993 | Yamaguchi et al. ............... 323/324 |
| 5,278,492 | * | 1/1994 | Huynh et al. ....................... 323/320 |
| 5,321,597 | | 6/1994 | Alacoque ............................ 363/25 |
| 5,550,463 | | 8/1996 | Coveley .............................. 323/300 |
| 5,796,599 | | 8/1998 | Raonic et al. ....................... 363/57 |
| 5,852,357 | * | 12/1998 | D'Souza ............................. 323/324 |
| 5,907,198 | * | 5/1999 | Lech .................................... 307/125 |

FOREIGN PATENT DOCUMENTS

| | | | |
|---|---|---|---|
| 29 14 277 | 10/1979 | (DE) | ................................ H05B/5/18 |
| 0 822 645 | 2/1998 | (EP) | ............................. H02M/5/257 |

OTHER PUBLICATIONS

European Patent Abstract of Japanese Publication No. 01298811. Dec. 1, 1989.

European Patent Abstract of Japanese Publication No. 58048529. Mar. 22, 1983.

European Patent Abstract of Japanese Publication No. 04135938. May 11, 1992.

* cited by examiner

*Primary Examiner*—Jeffrey Sterrett
(74) *Attorney, Agent, or Firm*—Theodore E. Galanthay; Stephen C. Bongini; Fleit, Kain, Gibbons, Gutman & Bongini P.L.

(57) ABSTRACT

A circuit is provided for supplying a load from an AC voltage supply. The circuit includes a control circuit and a bidirectional switch coupled in series with the load. The bidirectional switch includes two one-way switches connected in antiparallel, and the control circuit controls the bidirectional switch based on a relatively low DC voltage. The bidirectional switch is connected to a first terminal of the AC voltage supply, and the DC voltage is referenced to the first terminal of the AC voltage supply. Additionally, an apparatus connected to an AC voltage supply and a relatively low DC voltage is provided. The apparatus includes a control circuit, a load to be supplied by the AC voltage supply, and a bidirectional switch coupled in series with the load. The bidirectional switch includes two one-way switches connected in antiparallel, and the control circuit controls the bidirectional switch based on the DC voltage. The bidirectional switch is connected to a first terminal of the AC voltage supply, and the DC voltage is referenced to the first terminal of the AC voltage supply. In one preferred embodiment, each of the two one-way switches includes a MOS transistor coupled in series with a diode.

21 Claims, 3 Drawing Sheets

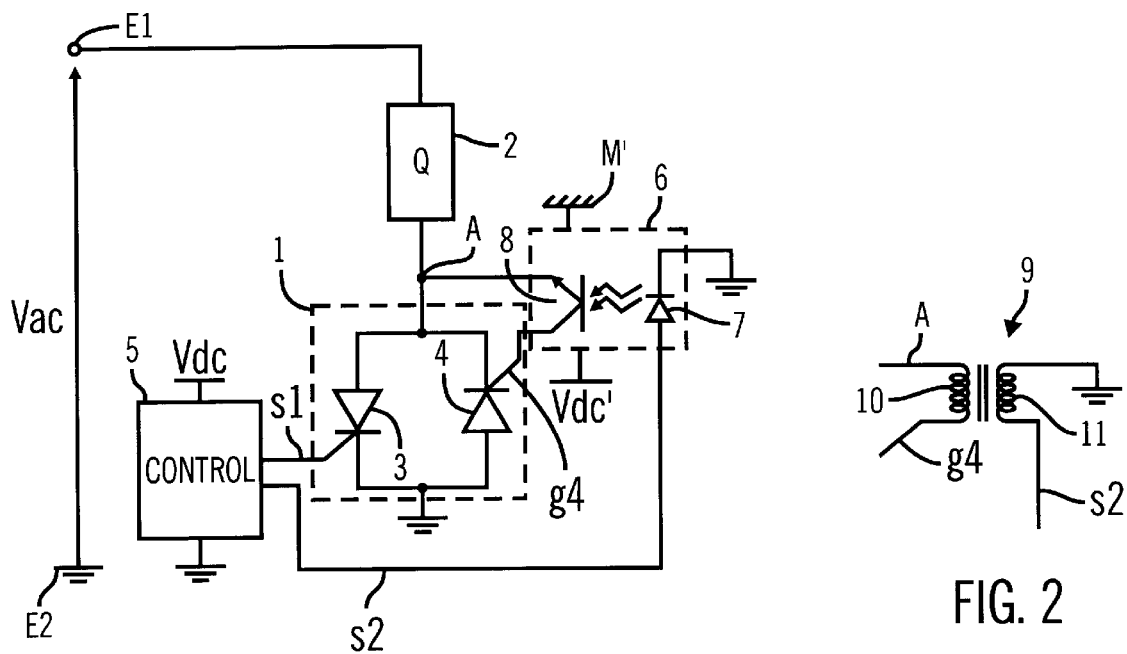
FIG. 1
FIG. 2
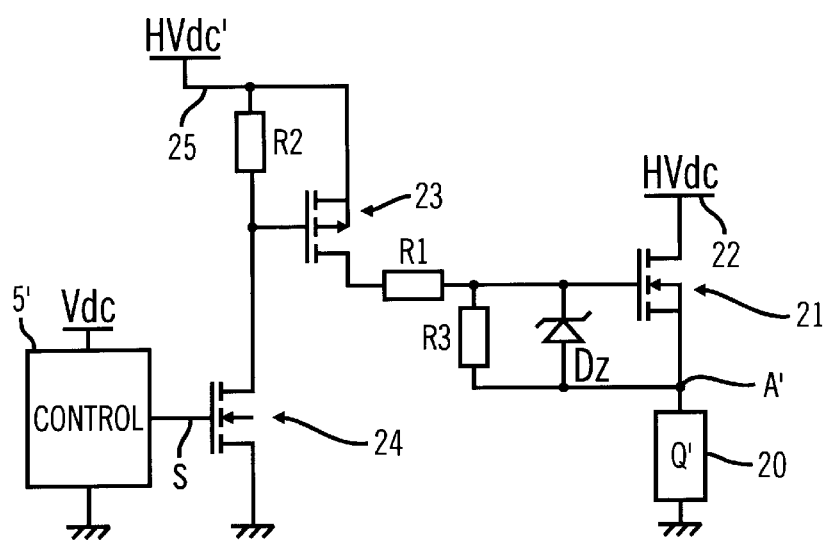
FIG. 3

CIRCUIT HAVING A BIDIRECTIONAL SWITCH FOR SUPPLYING A LOAD FROM AN AC VOLTAGE SUPPLY

CROSS-REFERENCE TO RELATED APPLICATIONS

This application is based upon and claims priority from prior French Patent Application No. 98-15150, filed Nov. 27, 1998, the entire disclosure of which is herein incorporated by reference.

BACKGROUND OF THE INVENTION

1. Field of the Invention

The present invention relates to switches for a load supplied by an AC voltage, and more specifically to a circuit for controlling an AC load using a low voltage control signal.

2. Description of Related Art

The control of an AC load from an AC voltage power system implies the use of a switch which is bidirectional both in current and voltage, that is, a four-quadrant switch. The present invention more specifically applies to such a switch made by means of two distinct switches for the two directions of the current, conversely to a triac, which is bidirectional. In an assembly with two one-way switches, the two switches may be openable (i.e., blockable) according to a constraint of opening under a non-zero current.

A problem which arises in any assembly using two semiconductor switches to make a four quadrant switch is the fact that one of the two switches must be controlled with a floating potential. This problem is illustrated by FIG. 1 which shows a conventional example of a four-quadrant switch 1 in series with a load 2 between two terminals E1 and E2 of an AC voltage source Vac (e.g., a main of 240V/50 Hz or 110V/60 Hz). In the example of FIG. 1, switch 1 is formed of two thyristors 3 and 4 mounted in antiparallel between a terminal A of load 2 and terminal E2, for example, the neutral of the AC power supply forming the assembly ground.

The use of thyristors implies an application in which it is not necessary to open switch 1 under a non-zero current, since thyristors are turned off by the disappearance of the current flowing therethrough. To have a possibility of opening under a non-zero current, blockable components, for example, MOS transistors, are used, as will be seen hereafter. Thyristors 3 and 4 are controlled from a control block 5 supplied, generally, by a low DC voltage Vdc provided by an auxiliary power supply. Control block 5 provides, in conventional assemblies, two control signals s1 and s2 intended, respectively, for thyristors 3 and 4.

The control of thyristor 3 by signal s1 raises no particular reference problem, since the anode of this thyristor is connected to the same ground as control block 5. However, the control of thyristor 4 must be performed via an isolation block 6, since the thyristor cathode is connected to node A. In the example of FIG. 1, isolating block 6 is an optocoupler, the emitting diode 7 of which receives, on its anode, signal s2 provided by control block 5 and the cathode of which is connected to the ground E2 common to control block 5 and to AC load 2 (via switch 1). Phototransistor 8 of optocoupler 6 is connected, by its collector, to gate g4 of thyristor 4 and, by its emitter, to node A.

The biasing of phototransistor 8 requires a DC auxiliary supply Vdc', different from supply Vdc of control block 5. Indeed, the emitter of phototransistor 8 must be connected to a reference potential M', which is necessarily different from the ground E2 of the rest of the assembly, and thus from the reference potential of voltage Vdc. Isolation block 6 thus is generally supplied by a voltage Vdc' referenced to potential M'. The operation of a bidirectional switch 1 such as shown in FIG. 1 is well known. Control block 5 organizes the respective conduction states of thyristors 3 and 4 according to the halfwave of AC supply Vac and according to a control reference which depends on the application.

A disadvantage of a circuit such as that shown in FIG. 1 is that the use of an optocoupler requires two galvanically isolated auxiliary power supplies Vdc and Vdc' having different references. To replace optocoupler 6 of FIG. 1, a pulse transformer 9 may also be used, as illustrated in FIG. 2. For simplification, FIG. 2 does not show all of the elements of the assembly of FIG. 1. Only transformer 9 is shown therein, the rest of the assembly is similar. A first winding 10 of transformer 9 is connected between terminal A and gate g4 of thyristor 4 (FIG. 1), that is, similarly to the connection of phototransistor 8. A second winding 11 of transformer 9 is connected between the assembly ground E2 and the terminal providing control signal s2.

A disadvantage of the solution partially illustrated in FIG. 2 is the use of a pulse transformer. Further, the pulse transformer used is a transformer operating at a high frequency as compared to the frequency of voltage Vac, to reduce the bulk. Control block 5 of the assembly must then provide high frequency control pulses. Further, a solution using a transformer such as illustrated by FIG. 2 excludes the use of transistors to form the switch. Indeed, to use transistors (for example, MOS power transistors) instead of the thyristors, the control signal cannot be an AC signal but must be a DC signal, which then requires rectifying the transformer signal and complicates the circuit. Another disadvantage common to the two conventional examples hereabove, be it an optocoupler or a pulse transformer assembly, is that neither of the two assemblies is integrable.

A control circuit for a bidirectional switch that has two unidirectional switches associated in antiparallel is disclosed in U.S. Pat. No. 5,796,599. More specifically, the disclosed control circuit controls the switches using two DC voltages that are generated at the terminals of two capacitors, each of which is connected to one of the switches. However, such a circuit requires two distinct DC voltages for controlling the thyristors of the unidirectional switches. Further, these voltages are referenced to different potentials that correspond to the respective power terminals of the switches. Thus, there is the absence of a common reference, and this makes it compulsory to include an insulating device (e.g., an optocoupler or transformer).

SUMMARY OF THE INVENTION

In view of these drawbacks, it is an object of the present invention to overcome the above-mentioned drawbacks and to provide a switch which is bidirectional in current and voltage, made and formed by two distinct semiconductor components. The switch is preferably formed by two one-way semiconductor switches mounted in antiparallel.

Another object of the present invention is to provide a switch that avoids the need for two auxiliary power supplies to control the switch, without having to use a high-frequency transformer.

A further object of the present invention is to provide a control circuit which is integrable.

Yet another object of the present invention is to provide a device of the level shifter assembly-type used for DC power supplies that can be used to supply an AC load.

One embodiment of the present invention provides a circuit for supplying a load from an AC voltage supply. The circuit includes a control circuit and a bidirectional switch coupled in series with the load. The bidirectional switch includes two one-way switches connected in antiparallel, and the control circuit controls the bidirectional switch based on a relatively low DC voltage. Further, the bidirectional switch is connected to a first terminal of the AC voltage supply, and the DC voltage is referenced to the first terminal of the AC voltage supply. In a preferred embodiment, the two one-way switches are controlled by two signals that are referenced to the reference potential of the DC voltage.

Another embodiment of the present invention provides an apparatus connected to an AC voltage supply and a relatively low DC voltage. The apparatus includes a control circuit, a load to be supplied by the AC voltage supply, and a bidirectional switch coupled in series with the load. The bidirectional switch includes two one-way switches connected in antiparallel, and the control circuit controls the bidirectional switch based on the DC voltage. Additionally, the bidirectional switch is connected to a first terminal of the AC voltage supply, and the DC voltage is referenced to the first terminal of the AC voltage supply. In one preferred embodiment, each of the two one-way switches includes a MOS transistor coupled in series with a diode.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 1 and 2 show conventional four-quadrant switch circuits;

FIGS. 3 and 4 show level shifter assemblies;

DETAILED DESCRIPTION OF PREFERRED EMBODIMENTS

Figure 4:
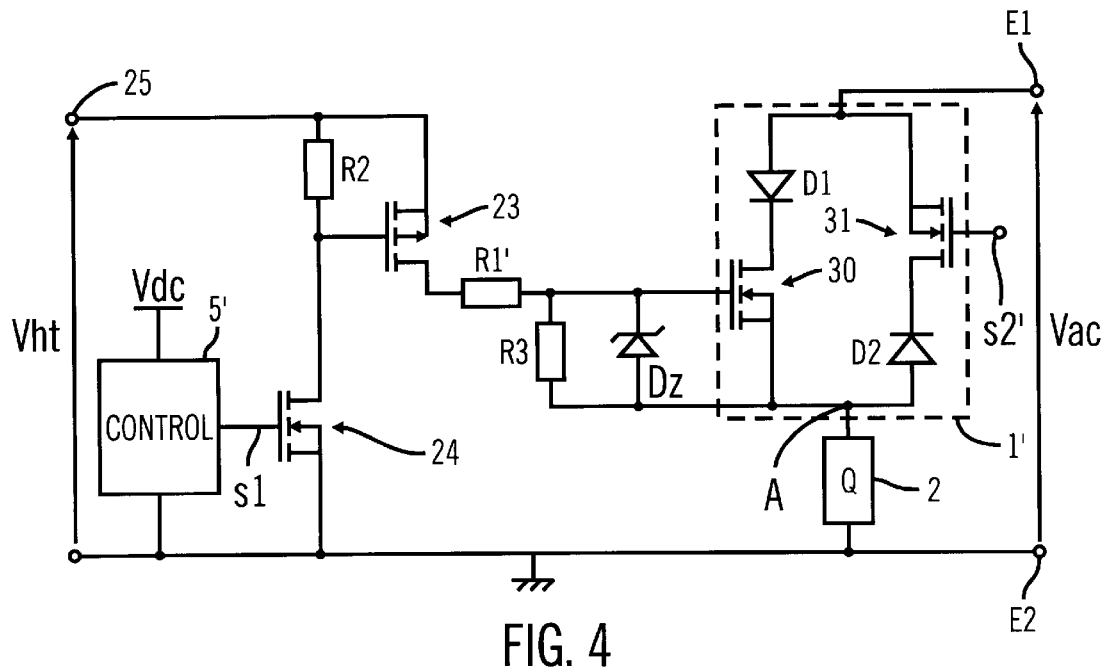

Preferred embodiments of the present invention will be described in detail hereinbelow with reference to the attached drawings. For clarity, the same elements have been designated with the same reference numerals in the different drawings.

Level shifter assemblies are generally used to control MOS components with a floating potential, and are unidirectional in voltage. These voltage shifters are thus used for DC power supplies. A level shifter assembly is designed to control an N-channel MOS transistor, mounted on the positive side of the power supply, that is, where the load is connected between the source of the MOS transistor and the reference of the control block. The drain of the MOS transistor is connected on the positive potential side.

FIG. 3 shows a diagram of a level shifter assembly for supplying a load 20 from a high DC voltage HVdc, load 20 being mounted in series with a switch 21 which is unidirectional in voltage (generally, an N-channel MOS transistor), between a terminal 22 of voltage source HVdc and the assembly ground. The level shifter circuit includes a P-channel MOS transistor 23, the source of which is connected to a terminal 25 of voltage source HVdc', which is greater than voltage HVdc but has the same reference. The drain of transistor 23 is connected, via a resistor R1, to the gate of transistor 21.

Transistor 23 is controlled by means of an N-channel MOS transistor 24, series-connected with a resistor R2 between terminal 25 and ground. The midpoint of this series association is connected to the gate of transistor 23. The gate of transistor 24 receives a control signal s from a control block 5' supplied by a low voltage Vdc (generally obtained based on voltage HVdc). A Zener diode DZ connects the gate of transistor 21 to node A' of interconnection of transistor 21 with load 20. A resistor R3 is connected in parallel with diode DZ.

The operation of a level shifter assembly such as illustrated in FIG. 3 is as follows. The application of a positive voltage on the gate of transistor 24 by signal s turns it on and lowers the potential of the gate of transistor 23 substantially to around (neglecting the drain-source resistance of transistor 24 in the on state). As a result, transistor 23 turns on. Voltage HVdc' is then applied on the drain of transistor 23 (neglecting the drain-source resistance of transistor 23 in the on state). Resistors R1 and R3 form a dividing bridge, the midpoint of which is connected to the gate of transistor 21. For example, resistors R1 and R3 have the same value, so that the maximum voltage applied to the gate of transistor 21 corresponds to the difference between voltages HVdc' and HVdc, divided by two.

The function of the Zener diode DZ is to set the gate-source voltage of transistor 21 to the threshold voltage of this Zener diode when transistor 23 is turned on by control block 5' (by the turning-on of transistor 24). Once transistor 21 is turned on, the voltage across load 20 is equal to HVdc (neglecting the drain-source resistance of transistor 21 in the on state). As a result, the potential difference between the source of transistor 23 and the source A' of transistor 21 becomes equal to the difference between voltages HVdc' and HVdc.

Voltage HVdc' is chosen to be sufficiently high with respect to voltage HVdc (for example, HVdc'=HVdc+20 volts) for transistor 21 to have its gate maintained at a sufficiently high potential with respect to its source A' to remain on. Transistor 21 is turned off by the turning-off of transistor 23 (and thus, by the turning-off of transistor 24). Resistor R3 is then used to discharge the gate of transistor 21 to turn it off. It should be noted that, even for an application in the DC mode, a level shifter suffers from the compulsory use of an additional auxiliary power supply for generating voltage HVdc'.

A level shifter assembly of the type used for a DC load can be transposed to an assembly supplied by an AC voltage. FIG. 4 illustrates such a transposition. Since load 2 has to be supplied by an AC voltage source Vac, MOS transistor 21 (FIG. 3) has been replaced with an assembly 1' of two one-way switches mounted in antiparallel. In the example of FIG. 4, these are two N-channel MOS transistors 30 and 31, respectively associated in series with diodes D1 and D2 reversed with respect to each other, the two resulting series associations being mounted in parallel between terminal E1 (the phase of supply Vac) and node A of interconnection of load 2 with switch 1'. More specifically, transistor 30 is series-connected with a first diode D1, the anode of which is connected to terminal E1 and the cathode of which is connected to the drain of transistor 30, the source of transistor 30 being connected to node A.

Transistor 31 is associated in series with a second diode D2, the anode of which is connected to node A and the cathode of which is connected to the drain of transistor 31, the source of which is connected to terminal E1. The other components of the assembly are transposed from a level shifter such as shown in FIG. 3. Thus, a Zener diode DZ is connected between the gate of transistor 30 and node A. A resistor R3 is connected in parallel with diode DZ. An N-channel MOS transistor 24, controlled by a control block 5' supplied by a DC voltage Vdc, is used to control a P-channel MOS transistor 23, the source of which is connected to terminal 25 of voltage source Vht and the drain of which is connected, via a resistor R1', to the gate of transistor 30. A resistor R2 is connected between the source and the gate of transistor 23, the latter being connected to the drain of transistor 24.

The operation of the assembly of FIG. 4 can be deduced from the operation described with respect to FIG. 3. The transposition of a level shifter assembly to an AC load has disadvantages which make such a solution difficult to apply in practice. A first disadvantage is that, to enable control of transistor 30 upon turning-on of transistor 23, DC voltage Vht must be a high voltage, with a value greater than the maximum amplitude of AC voltage Vac, to guarantee a positive gate-source voltage for transistor 30.

A second disadvantage is that, while transistor 23 is on, resistor R1' sees across its terminals a high voltage which can reach, at the minimum of a negative halfwave of voltage Vac, the amplitude of this voltage plus voltage Vht. Thus, for an AC main supply under 240 volts, resistor R1' sees across its terminals a voltage which exceeds 500 volts. This results in a strong dissipation in this resistor R1', which is a major disadvantage of the assembly of FIG. 4. It should indeed be noted that the voltage between terminal 25 and node A is, when transistor 23 is on, essentially across resistor R1', because the voltage across resistor R3 remains low, as it is limited by Zener diode DZ.

Another disadvantage of the assembly of FIG. 4 is that it does not enable generation of a control signal s2' for P-channel MOS transistor 31, which is not referenced to the ground as is the case for control signal s1 of transistor 24. Indeed, signal s2' must be referenced to the potential of terminal E1, and thus to the phase of the AC power supply, while control block 5' is supplied by voltage Vdc referenced to the assembly ground E2. Because of all the above disadvantages, the transposition of a level shifter assembly applying to a DC voltage to an AC power supply is impractical.

For simplification, only those elements of the control circuit which are necessary to the understanding of the present invention have been shown in the drawings and will be described hereafter. In particular, the structure of the blocks generating the control signals from a low voltage DC power are not detailed, either for the previously-described circuits or for the circuits described below. The structure of these blocks is known to those of ordinary skill in the art. This structure depends, in particular, on the load to be controlled and on the application (for example, variator, chopper, static switch, etc.). Similarly, the realization and the adaptation of an auxiliary power supply according to the application are known to those of ordinary skill in the art. By convention and unless otherwise specified, in the present description all voltages are considered as being referenced to the ground or to the neutral of the AC power supply.

Figure 5:
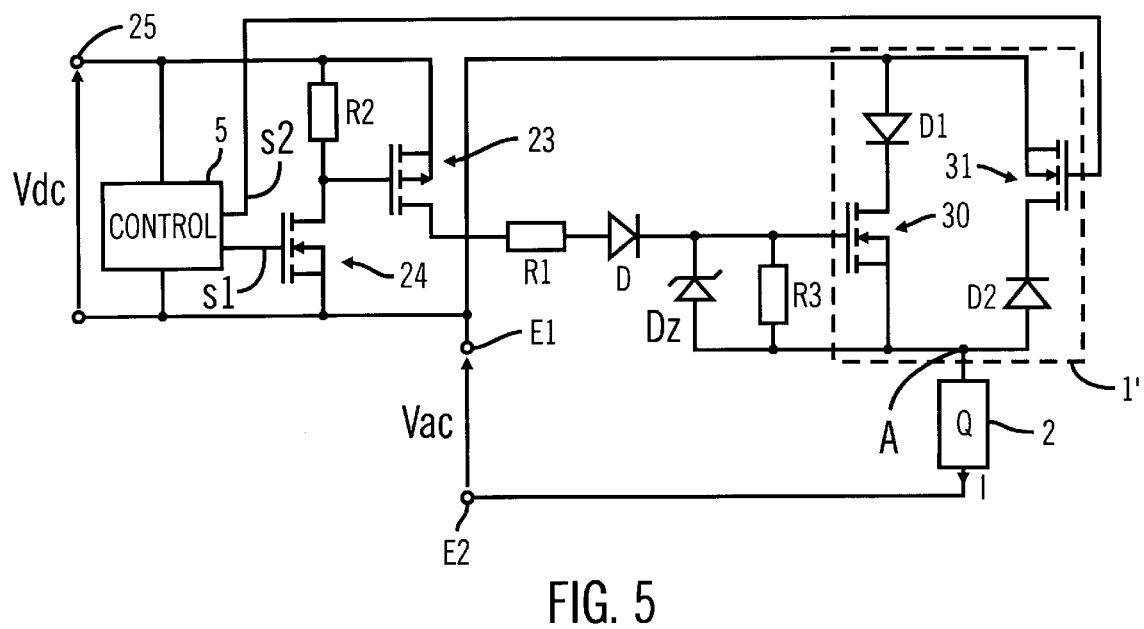
FIG. 5 shows a control circuit for a bidirectional switch that is formed of two voltage-controlled one-way semiconductor switches according a first embodiment of the present invention.

FIG. 5 shows a control circuit according to a first embodiment of the present invention. This embodiment is, more specifically, intended for the control of a bidirectional switch 1' formed by two N-channel MOS transistors 30 and 31, associated in an antiparallel assembly with two diodes D1 and D2, such as previously described in relation to FIG. 4. Switch 1' is, as in the case of FIG. 4, connected between a terminal E1 and node A of the series association of switch 1' with a load 2 to be supplied by an AC voltage source Vac. Bidirectional switch 1' is intended to be controlled by a control block 5 supplied by a low DC voltage source Vdc.

In embodiments of the present invention, DC supply voltage Vdc and AC supply voltage Vac are associated in series. Thus, DC voltage Vdc is referenced to the potential of terminal E1, that is, in practice, to the phase of AC supply Vac. As a result, only the terminal of load 2 which is opposite to node A is connected to the neutral E2 of the AC power supply. Further, the value of the low control voltage (for example, 5, 12, 24, or 48 volts) provided by the auxiliary power supply is independent from the value of the load AC supply voltage (for example, 240 volts or 110 volts).

Control block 5 is powered between a positive terminal 25 of voltage source Vdc and terminal E1. Block 5 provides, for example, two control signals s1 and s2. Signal s1 is applied to the gate of an N-channel MOS transistor 24, the source of which is connected to terminal E1 and the drain of which is connected, via a resistor R2, to terminal 25. The junction point of resistor R2 and transistor 24 is connected to the gate of a P-channel MOS transistor 23, the source of which is connected to terminal 25. The drain of transistor 23 is connected, via a resistor R1 in series with a diode D, to the gate of N-channel MOS transistor 30 of switch 1'. A Zener diode DZ and a resistor R3 are connected in parallel between the gate and the source of transistor 30.

The function of diode D is to protect DC power supply Vdc against a reverse voltage. Indeed, in the absence of a diode D, a current could flow from the AC power supply to transistor 23. Diode D may be omitted if transistor 23 can withstand a sufficient bidirectional voltage. Further, clue to diode D, the (low) control voltage is decorrelated from the (high) load supply voltage. The function of diode DZ is, as previously, to limit the gate-source voltage of transistor 30 to a voltage smaller than its breakdown voltage. As previously, resistor R3 is used to turn off transistor 30 by allowing the discharge of its gate.

Transistor 31 is now controlled by a signal s2 referenced to the same potential as signal s1 that controls transistor 24, that is, by means of the same control block 5, without requiring the use of an isolation component as in the conventional assemblies of FIGS. 1 and 2. For a closing control signal of switch 30 to be effective, the voltage between terminals 25 and A must be positive (sufficient for transistor 30 to be turned on when transistor 23 is on) and the voltage between terminals E1 and A must also be positive for diode D1 to be forward-biased. For a closing control signal of switch 31 to be effective, the voltage between terminals s2 and E1 must be positive (sufficient for transistor 31 to be turned on), which is possible by having voltage Vdc referenced to terminal E1, and the voltage between terminals A and E1 must also be positive so that diode D2 is forward-biased.

First assume that transistors 30 and 31 have different control signals, that is, signals s1 and s2 have different shapes. Assume also that initially both switches 30 and 31 are open, so that the load is not supplied. Accordingly, the voltage between nodes A and E2 is zero. Fulfilling the conditions indicated above results in having positive voltages between terminals 25 and E2 and between terminals E1 and E2 to close switch 30, and respectively negative and positive voltages between terminals E1 and E2 and between terminals 25 and E1 to close switch 31. It should be noted that the condition of a positive voltage between terminals 25 and E1 is always fulfilled. Once the load is supplied, that is, when one of switches 30 or 31 is on, the voltage between terminals A and E1 is substantially zero (neglecting the series voltage drops in the conducting diode and transistor). Voltage Vdc between terminals 25 and E1 controls switches 30 and 31 to be closed.

In other words, two cases may occur for the turning-on of transistor 30. First, transistor 31 is on and the voltage between terminals A and E1 is substantially zero. As a result, the voltage between terminals 25 and A is equal to the voltage Vdc, which thus enables turning on transistor 30 (this is also true to turn on transistor 31 when transistor 30 is on). Second, transistor 31 is off and diode D1 then must be forward biased. As a result, the voltage between terminals E1 and A (and thus, between E1 and E2) must be positive, which imposes a voltage between terminals 25 and E2 which is greater than or equal to voltage Vdc, and thus sufficient to turn on transistor 30. Once the gate of transistor 30 is biased, one returns (by turning on transistor 30) to the case where the voltage between terminals E1 and A is zero.

It should be noted that, when transistor 30 is on, the current through diode D1 must remain sufficient for its forward biasing. This may lead (in particular, if transistor 31 is not on) to the blocking of diode D1 before the zero crossing of current I through the load, that is, when current I through the load becomes smaller than the hold current of transistor 30. It should thus be noted that the turning-on of transistor 30, more generally, of the one-way switch associated with the periods when current I through the load is positive (from terminal A to terminal E2) no longer raises problems.

Figure 6:
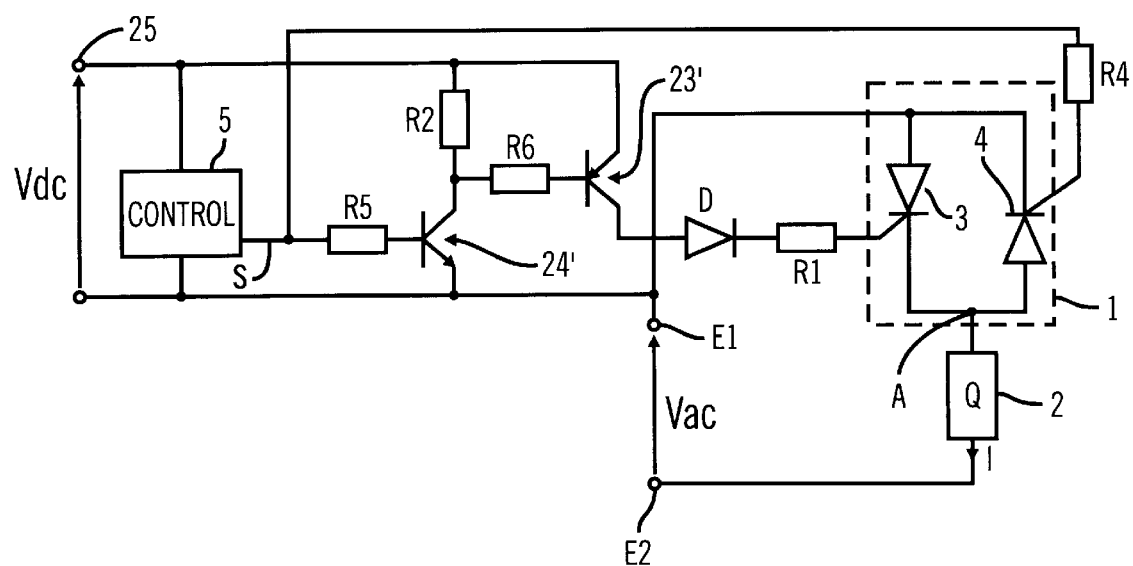
FIG. 6 shows a control circuit for a bidirectional switch that is formed of two current-controlled one-way semiconductor switches according to a second embodiment of the present invention.

Thus, the circuit according to embodiments of the present invention enables, in all cases, a control of switches 30 and 31 from positive control voltages for transistors or, as in the embodiment illustrated hereafter in relation with FIG. 6, for current-controlled switches, from positive currents. An advantage of the present invention is that a single auxiliary power supply source (Vdc) is sufficient to operate bidirectional switch 1'. Another advantage of the present invention is that it avoids using isolation components of the optocoupler or transformer type. Another advantage of the present invention is that, due to the presence of diode D and to the reference (E1) for voltage Vdc, resistor R1 only sees a low voltage.

It should be noted that the present invention may be used in multiple applications by simply adapting, in a manner within the abilities of one of ordinary skill in the art, the shape to be given to control signals s1 and s2. Thus, if the control is of static switch or power variator type, switches 30 and 31 are closed for one halfwave or by phase angle. If the circuit is a pulse-width modulation power converter (PWM), this raises no problems of frequency operation, and the operation is compatible with the fact that transistor 30 must be turned on only when voltage Vac is positive. Thus, in the case where a free wheel diode is in parallel with the load of a converter, the free wheel periods correspond to the periods when the voltage between terminals A and E2 is zero.

FIG. 6 shows a second embodiment of the present invention which applies to the case where bidirectional switch 1, in series with load 2, is formed of two thyristors 3 and 4 mounted in antiparallel. This implies that it is not necessary to open switch 1 under a zero current. In the embodiment of FIG. 6, an alternative embodiment of the control portion using bipolar transistors instead of the MOS transistors has also been illustrated. With respect to the circuit of FIG. 5, Zener diode DZ and resistor R3 for discharging the gate of transistor 30 are no longer necessary. Resistor R1 is used as a biasing resistor for thyristor 3. A resistor R4 must be inserted between the gate of thyristor 4 and output s of control block 5. In the example of FIG. 6, it has been assumed that signal s is used to simultaneously control thyristors 3 and 4 (which is the case, for example, for a phase angle power variation). It should be noted that such a control, even by a signal, of the one-way switches was impossible in the conventional circuits.

On the low voltage control side, transistor 24 of FIG. 5 is replaced with an NPN bipolar transistor 24'. MOS transistor 23 is replaced with a PNP bipolar transistor 23'. Resistors R5 and R6 are added between the output terminal of block 5 and the base of transistor 24', and between the collector of transistor 24' and the base of transistor 23', respectively, to enable the current control necessary for the operation of the bipolar transistors. Besides the difference of this current control, the operation of an assembly such as that illustrated in FIG. 6 is similar to that discussed in relation to FIG. 5.

It should be noted that different combinations of the diagrams of FIGS. 5 and 6 may be made. For example, a control by means of a MOS transistor 24 and a bipolar transistor 23' may be provided. Further, the choice of a bidirectional switch 1 or 1' is independent from the choice of a control block by means of bipolar transistors or MOS transistors. However, an advantage of the embodiment illustrated in FIG. 5 is that all of the components are integrable. The present invention is particularly suited for use as a static switch, a power dimmer, a chopper, or the like.

In various embodiment of the present invention, the sizing of the different components is adaptable by one of ordinary skill in the art according to the application and to the functional indications given hereabove. Further, it should be noted that, although the present invention has been discussed hereabove in relation to embodiments in which the load is connected to the neutral of the AC power supply, the transposition of the assembly of the present invention to a solution in which a terminal of the load is directly connected to the phase of the AC power supply and where the control reference is the neutral is within the ability of one of ordinary skill in the art. Further, it should be noted that other types of one-way semiconductor switches may be used to form a bidirectional switch such as described hereabove. For example, gate turn-off thyristors, IGBT transistors, or any other one-way switch that is conventionally used to form, by coupling with another one of same type, a four-quadrant bidirectional switch, may be used.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A circuit for supplying a load from an AC voltage supply, said circuit comprising:
   a bidirectional switch coupled in series with the load, the bidirectional switch including two one-way switches connected in antiparallel;
   a control circuit for controlling the bidirectional switch based on a single relatively low DC voltage; and
   a third switch coupled to a positive terminal of the DC voltage, the third switch controlling one of the one-way switches,
   wherein the bidirectional switch is connected to a first terminal of the AC voltage supply, and
   the DC voltage is referenced to the first terminal of the AC voltage supply.

2. The circuit as defined in claim 1, wherein the two one-way switches are controlled by two signals that are referenced to the reference potential of the DC voltage.

3. The circuit as defined in claim 1, wherein the two one-way switches are controlled by the same signal.

4. The circuit as defined in claim 1, further comprising means for keeping the value of the DC voltage independent from the value of the AC voltage supply.

5. The circuit as defined in claim 1, wherein each of the two one-way switches includes a MOS transistor coupled in series with a diode.

6. The circuit as defined in claim 1, wherein the third switch is coupled between the positive terminal of the DC voltage and a control terminal of the one of the one-way switches.

7. A circuit for supplying a load from an AC voltage supply, said circuit comprising:
   a bidirectional switch coupled in series with the load, the bidirectional switch including two one-way switches connected in antiparallel;
   a control circuit for controlling the bidirectional switch based on a single relatively low DC voltage; and
   a third switch and a first resistor coupled in series between a positive terminal of the DC voltage and a control terminal of one of the one-way switches,
   wherein the bidirectional switch is connected to a first terminal of the AC voltage supply, and the DC voltage is referenced to the first terminal of the AC voltage supply.

8. The circuit as defined in claim 7, wherein the third switch has a control terminal that is coupled to the common point between a second resistor and a fourth switch.

9. The circuit as defined in claim 8, wherein the third and fourth switches are formed by MOS transistors.

10. The circuit as defined in claim 8, wherein the second resistor and the fourth switch are coupled between the two terminals of the DC voltage.

11. The circuit as defined in claim 7, further comprising a diode coupled in series with the third switch and the first resistor.

12. An apparatus connected to an AC voltage supply and a relatively low DC voltage, said apparatus comprising:
    a load to be supplied by the AC voltage supply;
    a bidirectional switch coupled in series with the load, the bidirectional switch including two one-way switches connected in antiparallel;
    a control circuit for controlling the bidirectional switch based on the DC voltage; and
    a third switch coupled to a positive terminal of the DC voltage, the third switch controlling one of the one-way switches of the bidirectional switch,
    wherein the bidirectional switch is connected to a first terminal of the AC voltage supply, and
    the DC voltage is referenced to the first terminal of the AC voltage supply.

13. The apparatus as defined in claim 12, wherein the two one-way switches are controlled by the same signal.

14. The apparatus as defined in claim 12, further comprising means for keeping the value of the DC voltage independent from the value of the AC voltage supply.

15. The apparatus as defined in claim 12, wherein the two one-way switches are controlled by two signals that are referenced to the reference potential of the DC voltage.

16. The apparatus as defined in claim 12, wherein each of the two one-way switches includes a MOS transistor coupled in series with a diode.

17. The apparatus as defined in claim 12, wherein the third switch is coupled between the positive terminal of the DC voltage and a control terminal of the one of the one-way switches.

18. An apparatus connected to an AC voltage supply and a relatively low DC voltage, said apparatus comprising:
    a load to be supplied by the AC voltage supply;
    a bidirectional switch coupled in series with the load, the bidirectional switch including two one-way switches connected in antiparallel;
    a control circuit for controlling the bidirectional switch based on the DC voltage; and
    a third switch and a first resistor coupled in series between a positive terminal of the DC voltage and a control terminal of one of the one-way switches,
    wherein the bidirectional switch is connected to a first terminal of the AC voltage supply, and
    the DC voltage is referenced to the first terminal of the AC voltage supply.

19. The apparatus as defined in claim 18, wherein the third switch has a control terminal that is coupled to the common point between a second resistor and a fourth switch.

20. The apparatus as defined in claim 19, wherein the second resistor and the fourth switch are coupled between the two terminals of the DC voltage.

21. The apparatus as defined in claim 19, wherein the third and fourth switches are formed by MOS transistors.

* * * * *